United States Patent
Zeng

(10) Patent No.: US 11,368,017 B2
(45) Date of Patent: Jun. 21, 2022

(54) SAFE OPERATION METHOD FOR VOLTAGE REDUCTION ARC SUPPRESSION OF GROUND FAULT PHASE OF NON-EFFECTIVE GROUND SYSTEM

(71) Applicant: CHANGSHA UNIVERSITY OF SCIENCE AND TECHNOLOGY, Hunan (CN)

(72) Inventor: Xiangjun Zeng, Hunan (CN)

(73) Assignee: CHANGSHA UNIVERSITY OF SCIENCE AND TECHNOLOGY, Hunan (CN)

( * ) Notice: Subject to any disclaimer, the term of this patent is extended or adjusted under 35 U.S.C. 154(b) by 304 days.

(21) Appl. No.: 16/616,975

(22) PCT Filed: Jul. 4, 2018

(86) PCT No.: PCT/CN2018/094419
§ 371 (c)(1),
(2) Date: Nov. 26, 2019

(87) PCT Pub. No.: WO2019/007349
PCT Pub. Date: Jan. 10, 2019

(65) Prior Publication Data
US 2021/0126450 A1 Apr. 29, 2021

(30) Foreign Application Priority Data
Jul. 5, 2017 (CN) .......................... 201710544978.8

(51) Int. Cl.
*H02H 9/08* (2006.01)
*G01R 31/52* (2020.01)
*G01R 31/08* (2020.01)

(52) U.S. Cl.
CPC ............. *H02H 9/08* (2013.01); *G01R 31/086* (2013.01); *G01R 31/52* (2020.01)

(58) Field of Classification Search
CPC .......... H02H 9/08; H02H 9/00; G01R 31/086; G01R 31/52; H02J 3/001; H02J 3/12
(Continued)

(56) References Cited

U.S. PATENT DOCUMENTS

| | | | |
|---|---|---|---|
| 4,580,186 A * | 4/1986 | Parker .................... | H02H 3/165 |
| | | | 361/50 |
| 6,888,709 B2 * | 5/2005 | Princinsky ............... | H02H 9/04 |
| | | | 361/107 |

(Continued)

FOREIGN PATENT DOCUMENTS

| | | |
|---|---|---|
| CN | 102074950 | 5/2011 |
| CN | 105044560 | 11/2015 |
| CN | 107276097 | 10/2017 |

OTHER PUBLICATIONS

"International Search Report (Form PCT/ISA/210) of PCT/CN2018/094419", dated Sep. 26, 2018, with English translation thereof, pp. 1-4.

*Primary Examiner* — Kevin J Comber
*Assistant Examiner* — Sreeya Sreevatsa
(74) *Attorney, Agent, or Firm* — JCIP Global Inc.

(57) ABSTRACT

The present invention discloses a safe operation method for voltage reduction arc suppression of a ground fault phase of a non-effective ground system, for use in ground fault safety operation of a neutral point non-effective ground generator or distribution network. When a single-phase ground fault occurs, an external voltage source is applied at a non-effective ground system side between a bus and the ground, or between a line and the ground, or between a neutral point and the ground, or between a shunting tap of a non-effective ground system side winding of a transformer and the ground, to reduce the fault phase voltage to be lower than the continuous burning voltage of a ground arc, thereby meeting the requirements of long-term non-stop safe operation. The (Continued)

operation means and control method effectively prevent power outages, and improve the reliability and security of power supply.

20 Claims, 6 Drawing Sheets

(58) Field of Classification Search
USPC .......................................................... 361/42
See application file for complete search history.

(56) References Cited

U.S. PATENT DOCUMENTS

| | | | |
|---|---|---|---|
| 2002/0190580 A1* | 12/2002 | West ....................... | H02M 1/15 |
| | | | 307/145 |
| 2007/0081281 A1* | 4/2007 | Hamer ................... | H02H 3/347 |
| | | | 361/42 |
| 2007/0085549 A1* | 4/2007 | Fischer ................. | G01R 29/16 |
| | | | 324/521 |
| 2009/0147414 A1* | 6/2009 | Lazarovich ............ | G01R 31/52 |
| | | | 324/509 |
| 2016/0041216 A1* | 2/2016 | Tang ...................... | G01R 31/08 |
| | | | 324/509 |

* cited by examiner

SAFE OPERATION METHOD FOR VOLTAGE REDUCTION ARC SUPPRESSION OF GROUND FAULT PHASE OF NON-EFFECTIVE GROUND SYSTEM

CROSS-REFERENCE TO RELATED APPLICATION

This application is a 371 of international application of PCT application serial no. PCT/CN2018/094419, filed on Jul. 4, 2018, which claims the priority benefit of China application no. 201710544978.8, filed on Jul. 5, 2017. The entirety of each of the above mentioned patent applications is hereby incorporated by reference herein and made a part of this specification.

BACKGROUND

Technical Field

The present invention relates to the technical field of single-phase ground fault suppression of non-effective ground systems, in particular to a safe operation method for voltage reduction arc suppression of a ground fault phase of a non-effective ground system.

Related Art

Domestic and international generator sets and distribution networks generally adopt neutral point non-effective ground methods. The non-effective ground system constitutes more than 95% of China's 6 kV and higher voltage level power grids. Nearly 70% of power outages are caused by faults of the system. The annual power outage losses have reached hundreds of billions of RMB. The non-effective ground system is different from a power transmission system, and the ground fault resistance is as high as several tens of kilohms, which is difficult to detect and protect. Long-term operation with faults endangers personal and equipment safety, and causes serious social and economic losses. Ground faults are prone to electric shocks, and the number of deaths per year is as high as thousands, second only to traffic accidents. Ground faults are prone to arc overvoltages, causing equipment to burn out and even causing "fire spread" accidents. Ground faults of large-scale units cannot be extinguished in time. Arc currents easily cause iron cores and windings to burn out, causing accident expansion and even fatal crash. A trip caused by a ground fault causes a power outages, which reduces power supply reliability and directly affect industrial production and people's living standards. Ground fault safety operation of the non-effective ground system is critical to grid security and even national security.

The conventional ground fault handling and operation modes of the non-effective ground system mainly include fault suppression and fault removal.

The ground fault suppression mainly realizes ground fault suppression of the non-effective ground system by reforming or controlling the neutral point grounding mode of a primary system of a power grid, adjusting the neutral point ground impedance and suppressing the voltage and current of a fault point, but can only run for 1 to 2 h, is prone to overvoltage, and has security risks.

Ground fault removal is mainly to select a fault line and cut off the fault point as soon as possible after the ground fault of the system occurs, so as to ensure the safe operation of the system. For example, from conventional manual line-by-line "exploratory trip", to line selection with the use of a fault line selection device and a fault indicator, and then to quick fault isolation by the feeder automation technology, all the fault removal technology leads to long power outage time and high investment cost, and seriously reduces the power supply reliability of the power distribution system.

To this end, active arc suppression methods for suppressing current and voltage at fault points have been studied at home and abroad. For example, in the article "*Ground Fault Neutralizer Full-Compensation Technology and Application*" published by Swedish Neutral Corporation in 2015, an active current arc suppression method was proposed: When a ground fault occurs, ground residual current is taken as a control target, current is injected into a neutral point through a residual current compensator to compensate ground fault full current (including reactive component residual current and active component residual current), and the voltage of the fault point is simultaneously reduced to zero, thereby achieving the purpose of full compensation on the ground fault current. This method is difficult to apply in practice because the fault residual current cannot be directly measured and the line zero sequence active current component is difficult to measure accurately.

The inventor proposed a distribution network ground fault arc suppression and protection method (Patent Application No. 201110006701.2) in 2011, in which certain current is injected into the distribution network to force the fault phase voltage and the ground fault current to zero, thereby achieving 100% arc suppression of instantaneous faults and rapid isolation of permanent faults, and solving the technical problems of poor arc suppression effect of the current arc suppression method and low reliability of the conventional protection method. However, this method may cause the non-fault phase voltage to rise $\sqrt{3}$ times, and the long-term operation poses a threat to electrical insulation, and causes breakdown of a weak insulation position of the non-fault phase, which is then developed into an inter-phase short circuit to affect the power supply reliability.

In short, the prior art cannot balance the power supply reliability and safety of the non-effective ground system.

SUMMARY

In order to overcome the above shortcomings of the prior art, the present invention provides a safe operation method for voltage reduction arc suppression of a ground fault phase of a non-effective ground system.

The objective of the present invention is realized by the following technical solution:

A safe operation method for voltage reduction arc suppression of a ground fault phase of a non-effective ground system, for use in ground fault safe operation of a neutral point non-effective ground generator or distribution network. When a single-phase ground fault occurs, an external voltage source is applied at a non-effective ground system side between a bus and the ground, or between a line and the ground, or between a neutral point and the ground, or between a shunting tap of a non-effective ground system side winding of a transformer and the ground, and a voltage output by the voltage source is $\dot{U}=\dot{U}_1+\Delta\dot{U}_0$, so that a fault phase voltage is reduced to achieve voltage arc suppression and active a voltage reduction operation of the ground fault; where $\dot{U}_1$ is a normal voltage of an access point when a normal grid voltage source is not connected, the variation of zero sequence voltage $\Delta\dot{U}_0$ is calculated from formula $\Delta\dot{U}_0=\dot{U}_{03}-\dot{U}_{01}$ or $\Delta\dot{U}_0=\dot{U}_{\varphi1}-\dot{E}_\varphi$, $\dot{U}_{03}$ is zero sequence voltage after active voltage reduction, $\dot{U}_{01}$ is a zero sequence voltage under normal operation, $\dot{E}_\varphi$, ($\varphi$=A or B or C) is a power voltage of a ground fault phase $\varphi$, $\dot{U}_{\varphi 1}$ is the fault phase voltage in a range of [0, $U_{\varphi 0}$) after the external voltage source is applied, and $U_{\varphi 0}$ is the fault phase voltage before the external voltage source is applied.

In order to better achieve the objective of the present invention, the present invention may further adopt the following technical means:

During voltage reduction operation, a current $\dot{I}$ injected by the voltage source is measured and calculated, and a magnitude and a phase of the external voltage source $\dot{U}$ are regulated to establish formula $\dot{I}=\Delta\dot{U}_0 \cdot \Sigma Y_0$, so that the arc of a fault point is suppressed, where $\Sigma Y_0$ is a zero sequence admittance to a ground when the non-effective ground system runs normally.

Further, during the voltage reduction operation, a damping rate $$d = \frac{g}{\omega C} = \frac{U_0 g}{U_0 \omega C} = \frac{I_{0R}}{I_{0C}} = \frac{P_o}{Q_0} = \cot \alpha_0$$

of the non-effective ground system or the damping rate of the ground fault line is measured and calculated; if the damping rate d is greater than a setting value, the magnitude and phase of the voltage $\dot{U}$ output by the voltage source are regulated, so that the fault phase voltage is further reduced to suppress the fault arc until d is smaller than or equal to the setting value, that is, fault arc blowout is determined, and safe operation of active voltage reduction of the ground fault phase is achieved; where g is a three-phase conductance to ground, $\omega$ is an angular frequency of the system, C is a three-phase capacitance to ground, $U_0$ is a zero sequence voltage, $I_{0R}$ is a zero sequence active current, $I_{0c}$ is a zero sequence capacitance current, $P_0$ is a zero sequence active power, $Q_0$ is a zero sequence reactive power, and $\alpha_0$ is a zero sequence admittance angle.

Further, during the voltage reduction operation of the distribution network, the zero sequence current of the ground fault line is measured; if the zero sequence current is greater than a setting value, the magnitude and phase of the voltage $\dot{U}$ output by the voltage source are regulated, so that the fault phase voltage is further reduced to suppress the fault current until the zero sequence current of the ground fault line is smaller than or equal to the setting value, and safe operation of active voltage reduction of the ground fault phase is achieved. The zero sequence current setting value is selected according to the fault current allowed by long-time safe operation of the fault line with a single-phase ground fault and is generally [1A, 30A], or selected according to the suppression rate of the ground fault current and is generally [0.001$I_0$, $I_0$), where— $I_0$ is zero sequence current of the ground fault line before an external adjustable current source is applied.

Further, after the ground fault is detected, the application of the external voltage source continues for a period of time, then the voltage source is disconnected, whether the ground fault exists is detected again, and if the fault does not exist, it is determined that the instantaneous ground fault has been extinguished to restore normal operation; otherwise, the external voltage source is applied again to continue the active voltage reduction operation of the ground fault phase; and the duration of the external voltage source is generally (0.1 s, 60 s).

Further, the voltage source is a voltage source with adjustable amplitude and phase realized by power electronic components, or a voltage source output by an external single-phase transformer.

Further, the setting value of the damping rate d is set to be $K_3$ times the damping rate of the system or the line in normal operation; and the coefficient $K_3$ is in a range of (1, 5].

Further, the input voltage of the voltage source comes from a secondary side voltage of the transformer of the non-effective ground system, and is identical to the fault phase power voltage in phase; in this way, when the voltage source is regulated, the phase does not need to be regulated, and only the amplitude needs regulated, so that the method is simple and economical.

Further, a single-phase voltage regulator is installed in the voltage source circuit to regulate the amplitude of the voltage.

Further, a protection device is arranged in an output circuit of the voltage source to prevent the equipment from being damaged by high current.

Further, the transformer is a Z-type ground transformer or a Y/Δ wiring transformer or a Y/Y/Δ wiring transformer connected with the non-effective ground system.

It should be noted that the detection method and fault phase selection technology of the single-phase ground fault of the non-effective ground system are very mature at present, and various optional technical means can be adopted. The present invention no longer describes how to detect the fault. Normally, if the zero sequence voltage variation of a system exceeds a setting value, it is determined that a ground fault has occurred.

In addition, the inventor pioneered the theory of voltage reduction operation of a ground fault phase of a non-effective ground system, and based on the theory, the present invention first proposes a technical solution that an external adjustable voltage source is applied at a non-effective ground system side between a bus and the ground, or between a line and the ground, or between a neutral point and the ground, or between a shunting tap of a non-effective ground system side winding of a transformer and the ground, where the technical solution greatly simplifies the control method of fault suppression.

The present invention has the following beneficial effects:

1. The operation means and control method are simple and reliable. In the present invention, the fault phase voltage is used as a control target, and phase-to-ground parameters of the system do not need to be accurately measured, thereby avoiding the problem of poor suppression effect of the conventional current arc suppression method due to phase-to-ground parameter measurement errors of the system, and significantly improving the suppression precision by 80%.

2. The power supply reliability of the system is improved. Flexible control on the fault phase voltage is realized for the first time in the present invention. After a fault occurs, in the case of ensuring arc suppression, the fault phase voltage is reduced to run at [0, $U_{\varphi 0}$), where $U_{\varphi 0}$ is fault phase voltage before the external voltage source is applied. The rising amplitude of the non-fault phase voltage is reduced, the risk of insulation breakdown of the non-fault phase is lowered, the insulation breakdown of the non-fault phase can be effectively avoided, and the operation time of the non-effective ground system with the single-phase ground fault can be effectively prolonged.

3. The implementation cost is low. The arc suppression function can be realized without add an arc suppression system composed of multiple sets of primary equipment, so compared with the conventional arc suppression method, the installation investment of the equipment and device can be greatly reduced.

DETAILED DESCRIPTION

The following further describes and interprets the present invention with reference to the accompanying drawings.

Figure 1:
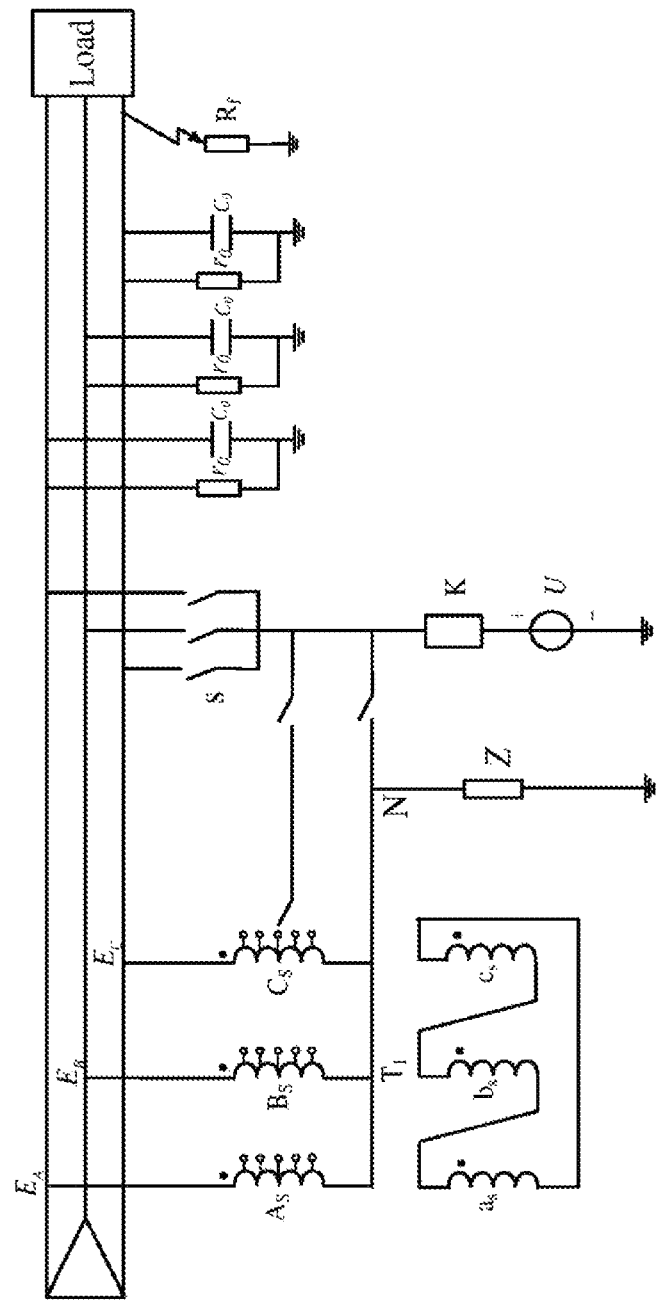
FIG. 1 is a principle diagram of safe operation of voltage reduction arc suppression of a ground fault phase of a non-effective ground distribution network using a Y/Δ wiring transformer.

As shown in FIG. 1, in a non-effective ground distribution network, $\dot{E}_A$, $\dot{E}_B$ and $\dot{E}_C$ are respectively three phases of power electromotive forces of a system, $C_0$ is system capacitance to ground, $r_0$ is system leakage resistance to ground; $A_s$, $B_s$ and $C_s$ are non-effective ground system side windings of a Y/Δ wiring transformer, S is a switch, K is a protection device (an overcurrent protection device or a fuse), outgoing lines at respective one ends of the non-effective ground system side windings of the transformer are directly connected with three phases A, B and C of a non-effective ground system, and the non-effective ground system side windings of the transformer are star-connected to lead out a neutral point N and then grounded through an impedance Z; $a_s$, $b_s$ and $c_s$ are low-voltage side windings of the transformer, and the low-voltage side windings are delta-connected. When a single-phase ground fault occurs, the ground fault resistance is $R_f$, the fault phase voltage φ is $\dot{U}_{\varphi 0}$ (φ=A or B or C), an external voltage source $\dot{U}$ is applied at the non-effective ground system side between a bus and the ground, or between a line and the ground, or between a neutral point and the ground, or between a shunting tap of the transformer $T_1$ and the ground to cause simultaneous rise or drop of ground voltage of the entire distribution system, the variation is $\Delta\dot{U}_0$, then $\dot{U}=\dot{U}_1+\Delta\dot{U}_0$, and the variation of zero sequence voltage $\Delta\dot{U}_0$ may also be calculated from formula $\Delta\dot{U}_0=\dot{U}_{03}-\dot{U}_{01}$ or $\Delta\dot{U}_0=\dot{U}_{\varphi 1}-\dot{E}_\varphi$; where $\dot{U}_1$ is normal voltage of an access point when a normal grid voltage source is not connected, $\dot{U}_{03}$ is zero sequence voltage after active voltage reduction, $\dot{U}_{01}$ is zero sequence voltage under normal operation, $\dot{E}_\varphi$ is power voltage of a ground fault phase, $\dot{U}_{\varphi 1}$ is fault phase voltage in a range of [0, $U_{\varphi 0}$) after the external voltage source is applied, and $U_{\varphi 0}$ is fault phase voltage before the external voltage source is applied.

Figure 2:
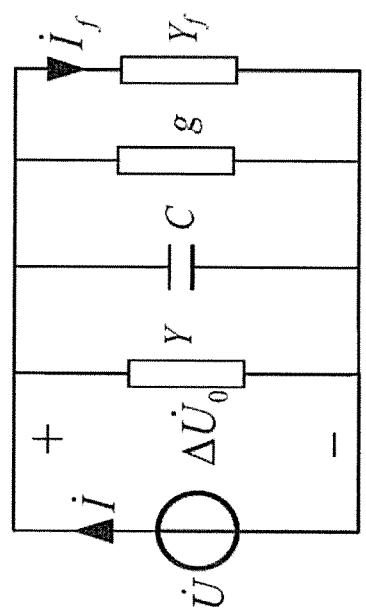
FIG. 2 is a zero sequence equivalent circuit diagram of a non-effective ground system when a ground fault occurs.

A zero sequence equivalent circuit in the non-effective ground system corresponding to FIG. 1, i.e., a zero sequence equivalent circuit of the non-effective ground system when a ground fault occurs, is as shown in FIG. 2. According to the Kirchhoff current equation, the current $\dot{I}$ injected by the voltage source $\dot{U}$ is:

$$\dot{I} = j3\dot{U}_0\omega C_0 + \frac{3\dot{U}_0}{r_0} + \frac{\dot{U}_C}{R_f} + \frac{\dot{U}_0}{Z} = \dot{U}_0 \Sigma Y_0 + \dot{U}_0 Y_f$$

In equation (1), the zero sequence admittance to ground of the distribution network is $$\Sigma Y_0 = \frac{1}{Z} + j3\omega C_0 + \frac{3}{r_0} = Y + j\omega C + g,$$

the grounding admittance of the neutral point is $$Y = \frac{1}{Z},$$

the three-phase conductance to ground is $$g = \frac{3}{r_0},$$

the three-phase capacitance to ground is $C=3C_0$, the conductance to ground in fault point is $$Y_f = \frac{1}{R_f},$$

and $\dot{U}_0$ is zero sequence voltage.

Considering the zero sequence voltage effect caused by asymmetry of three-phase ground parameters under normal operation of the non-effective ground system, the zero sequence voltage $U_0$ in equation (1) is replaced by a zero sequence voltage variation $\Delta\dot{U}_0^{\&}$; and considering the admittance to ground $Y_f=0$ of a fault point after fault arc suppression, equation (1) may be simplified as:

$$\dot{I}=\Delta\dot{U}\cdot\Sigma Y_0=(\dot{U}_{03}-\dot{U}_{01})\cdot\Sigma Y_0=(\dot{U}_3-\dot{U}_1)\cdot\Sigma Y_0 \quad (2)$$

Thus, during voltage reduction operation, the current $\dot{I}$ injected by the voltage source is measured and calculated, and the magnitude and phase of the external voltage source $\dot{U}$ are regulated to establish formula $\dot{I}=\Delta\dot{U}\cdot\Sigma Y_0$, so that the arc of the fault point is suppressed, where $\Sigma Y_0$ is a zero sequence admittance to ground when the non-effective ground system runs normally.

From the foregoing, after a ground fault occurs in the system, an external adjustable voltage source is adopted to realize active voltage reduction arc suppression, and the voltage output by the voltage source is uniquely determined by a target value of fault phase voltage reduction, which can be achieved by applying the external voltage source to a bus at the non-effective ground system side, or to a line, or to a neutral point, or to a shunting tap of a non-effective ground system side winding of the transformer.

Figure 3:
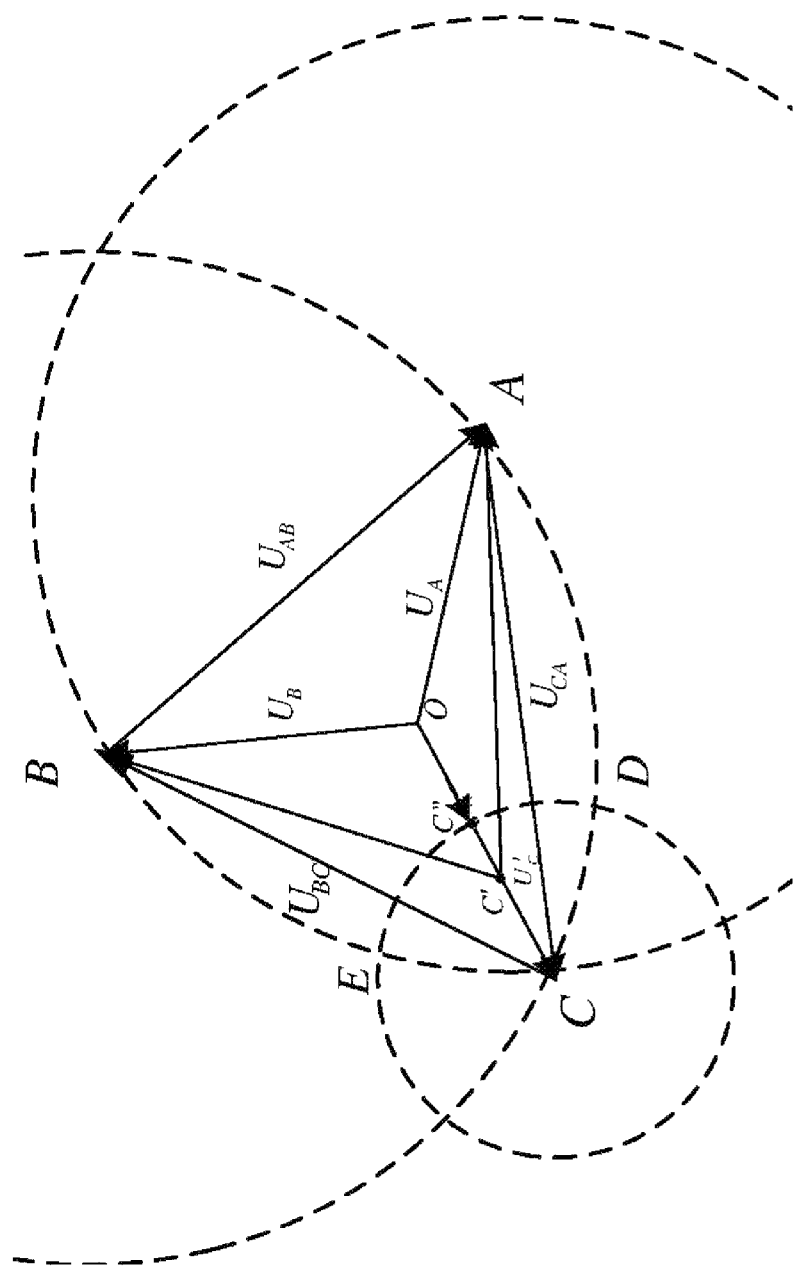
FIG. 3 is a phasor diagram of a voltage reduction arc suppression operation range of a ground fault phase of the non-effective ground system.

The following further discusses a fault phase voltage reduction operation range of fault arc suppression. As shown in FIG. 3, when the system is in normal operation, the voltage of the neutral point is zero, the A phase voltage vector is $\overrightarrow{OA}$, the B phase voltage vector is $\overrightarrow{OB}$, and the C phase voltage vector is $\overrightarrow{OC}$; taking the ground fault of the C phase as an example, set the maximum operating voltage amplitude of the fault phase to ensure fault phase arc suppression is CC'', the condition of fault phase arc suppression is: the zero potential point is within a circle centering on C and having a radius of CC''; in addition, in order to prevent insulation breakdown caused by overhigh voltage of a non-fault phase, the non-fault phase voltage is required to be smaller than a line voltage, that is, the zero potential point should be within a circle centering on point A and having a radium of AC, and a circle centering on point B and having a radium of BC. Thus, in order to ensure long-time safe operation of the non-effective ground system after voltage reduction of the fault phase, the zero potential point after voltage reduction of the fault phase is within an intersection of the three circles.

Figure 4:
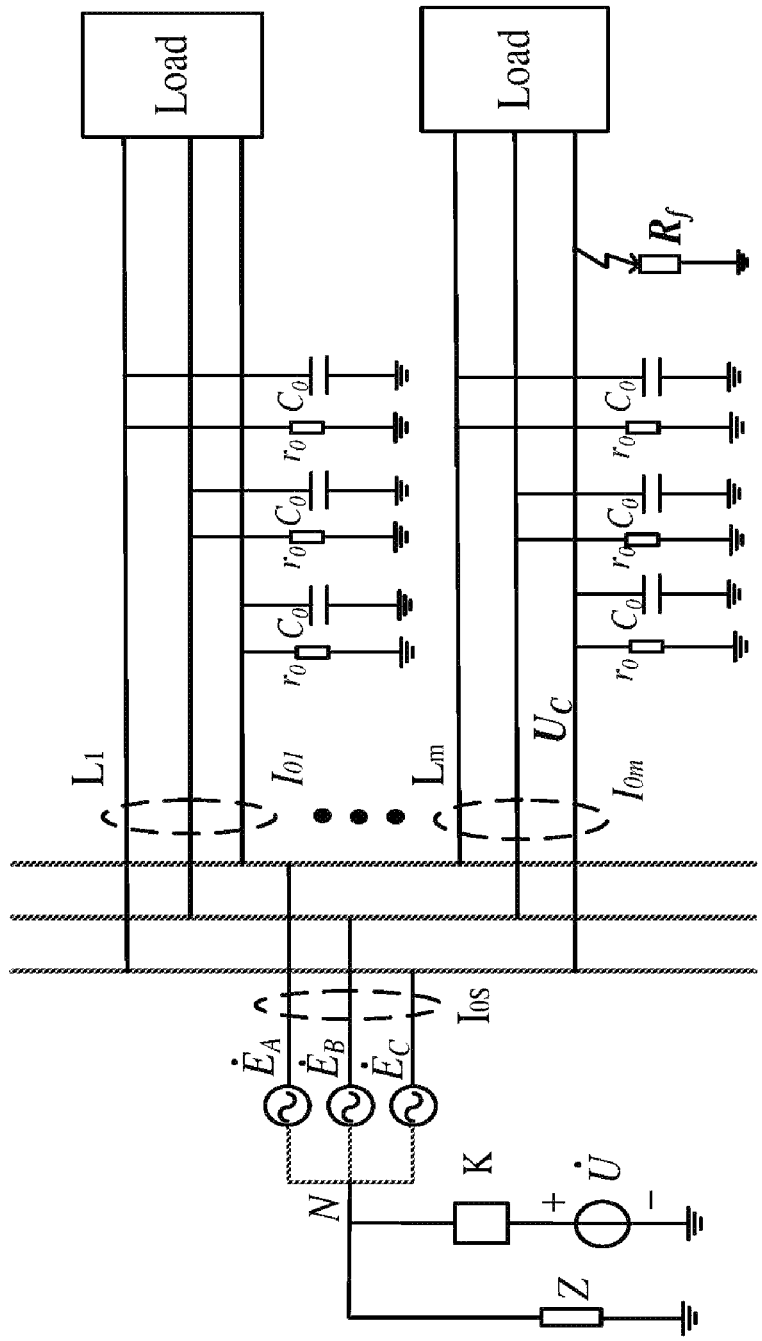
FIG. 4 is a measurement principle diagram of damping rate of a non-effective system or a line.

The following further discusses a method of judging fault arc suppression by measuring a damping rate. As shown in FIG. 4, during voltage reduction arc suppression, the damping rate of the system is calculated by measuring the zero sequence current $\dot{I}_{0S}$ and zero sequence voltage of the system, or the damping rate of the fault line m is calculated by measuring the zero sequence current $\dot{I}_{0m}$ and zero sequence voltage of the fault line m. The calculation formula of the damping rate of the non-effective ground system or the damping rate of the line is:

$$d = \frac{g}{\omega C} = \frac{U_0 g}{U_0 \omega C} = \frac{I_{0R}}{I_{0C}} = \frac{P_o}{Q_0} = \cot \alpha_0,$$

and the setting value of the damping rate d is set to be $K_3$ times the damping rate of the system or the line in normal operation; the coefficient $K_3$ is in a range of (1, 5]; if the damping rate d is greater than the setting value, the magnitude and phase of the voltage $\dot{U}$ output by the voltage source are regulated, so that the fault phase voltage is further reduced to suppress the fault arc until d is smaller than or equal to the setting value, that is, fault arc blowout is determined, and safe operation of active voltage reduction of the ground fault phase is achieved; where $$g = \frac{3}{r_0}$$

is three-phase conductance to ground, $\omega$ is angular frequency of the system, $C=3C_0$ is three-phase capacitance to ground, and $U_0$ is zero sequence voltage; $I_{0R}$ is zero sequence active current, and $I_{0C}$ is zero sequence capacitance current; $P_0$ is zero sequence active power, $Q_0$ is zero sequence reactive power, and $\alpha_0$ is zero sequence admittance angle.

Figure 5:
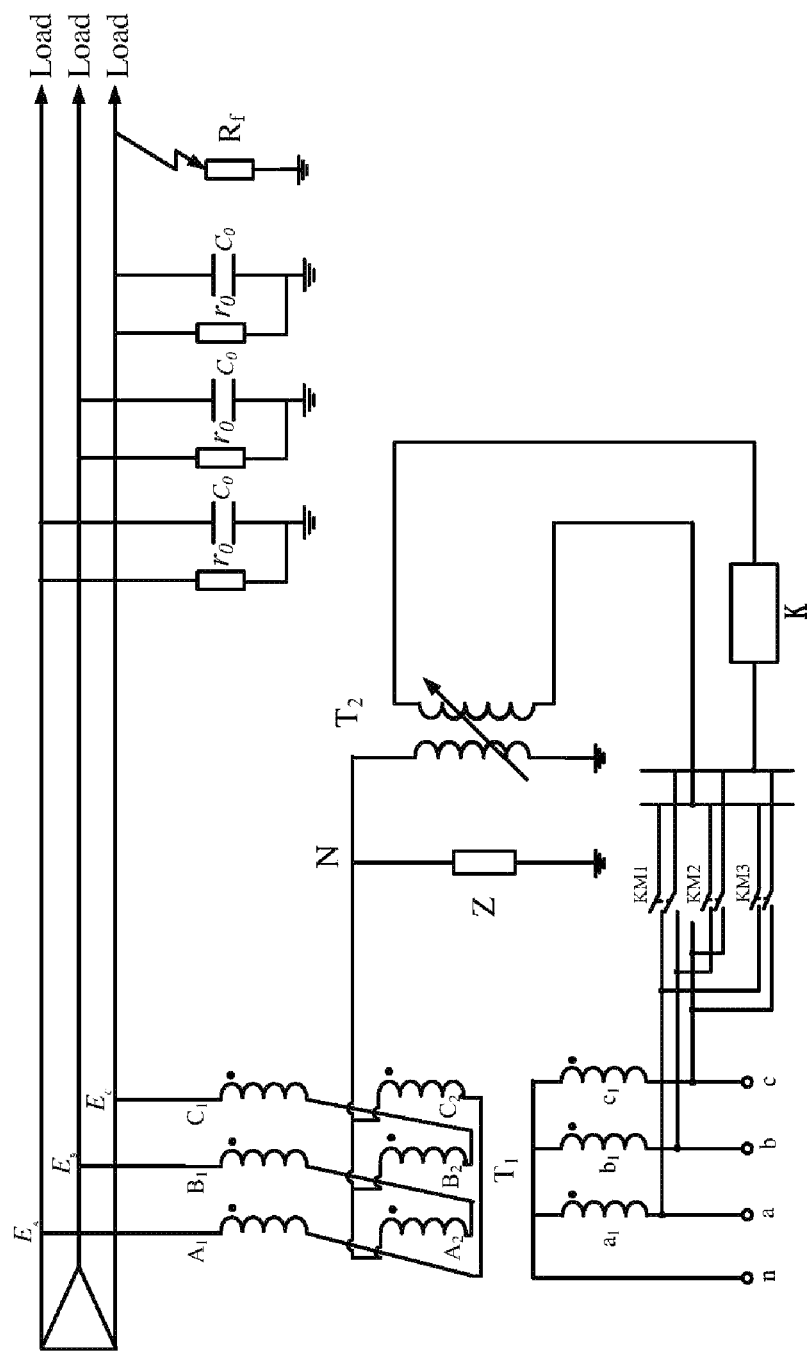
FIG. 5 is a principle diagram of safe operation of voltage reduction arc suppression of a ground fault phase of a non-effective ground distribution network using a Z-type ground transformer.

The above describes the technical principle of the present invention applied to a non-effective ground distribution network in detail. The technical principle is also applicable to the case where the present invention is applied to a non-effective ground generator. The following further describes the application of the present invention to the non-effective ground distribution network and generator:

As shown in FIG. 5, in a non-effective ground 10 kV distribution network, $E_A$, $E_B$ and $E_C$ are respectively three phases of power electromotive forces of a system, $E_A=E_B=E_C=10/\sqrt{3}$kV, the leakage resistance to ground of line $r_0$ is 4.7 kΩ, the capacitance to ground of line $C_0$ is 8.36 uF, K is a protection device (an overcurrent protection device or a fuse), the zero sequence current setting value of the ground fault line is set to 10 A, and the ground impedance Z of the neutral point N is j121Ω; $A_1$, $B_1$, $C_1$, $A_2$, $B_2$ and $C_2$ are non-effective ground system side windings of a Z-type ground transformer, KM1, KM2 and KM3 are contactors, outgoing lines at respective one ends of the non-effective ground system side windings of the transformer are directly connected with three phases A, B and C of a non-effective ground system, the non-effective ground system side windings of the transformer are connected in a Z shape, a neutral point N is led out from the other ends and then the windings are grounded through an impedance Z; $a_1$, $b_1$ and $c_1$ are low-voltage side windings of the Z-type ground transformer, the low-voltage side windings are star-connected, the leading-out terminals are represented by a, b, c and n, $T_1$ is the Z-type ground transformer that can provide a neutral point, $T_2$ is a voltage source output by an external single-phase transformer and connected between the neutral point and the ground, the input voltage of the single-phase transformer comes from the secondary side voltage of the ground transformer $T_1$ and is identical to a fault phase power voltage in phase, and the amplitude of the output voltage is adjustable. If a single-phase ground fault occurs in phase C, the ground fault resistance is represented by $R_f$, $R_f=1$ kΩ, and $\dot{U}_{C1}$ is the fault phase voltage. After the fault occurs, before the external voltage source is applied, the fault phase voltage is measured as $U_{C0}=2.60$ kV, and the critical voltage for sustaining continuous burning of a ground arc is 1.90 kV. At this time, the external adjustable voltage source $\dot{U}$ is applied between the neutral point of the non-effective ground distribution network and the ground, the normal voltage $U_1$ of an access point when the normal grid voltage source is not connected is 0 V, then it is obtained:

$$\dot{U}=\dot{U}_1-\dot{E}_C+\dot{U}_{C1} \qquad (3).$$

The external voltage source $\dot{U}$ is regulated to reduce the fault phase voltage $U_{C1}$ to be lower than a voltage for continuous burning of the ground arc, that is, $U_{C1}<1.90$ kV, thus achieving ground fault arc blowout. In this example, if the fault phase voltage $U_{C1}$ is reduced for arc suppression at 1.82 kV, the amplitude of voltage output by the voltage source may be adjusted first as U=3.95 kV, and then the contactor KM2 is closed to reduce the fault phase voltage to 1.82 kV, which satisfies the fault phase voltage operating range [0, 2.60 kV). At this time, the non-fault phase voltage is 8.51 kV, which is smaller than the line voltage 10 kV, thereby realizing arc suppression of the ground fault phase. Meanwhile, the non-fault phase voltage does not rise to the line voltage, thereby realizing safe operation of voltage reduction arc suppression.

During voltage reduction operation, the zero sequence current of a ground fault line is measured; if the zero sequence current is greater than a setting value 10 A, the magnitude of voltage output by the voltage source is continuously regulated, so that the fault phase voltage is further reduced to suppress the fault current until the zero sequence current of the ground fault line is smaller than or equal to the setting value 10 A, and safe operation of voltage reduction arc suppression of the ground fault phase is achieved.

Figure 6:
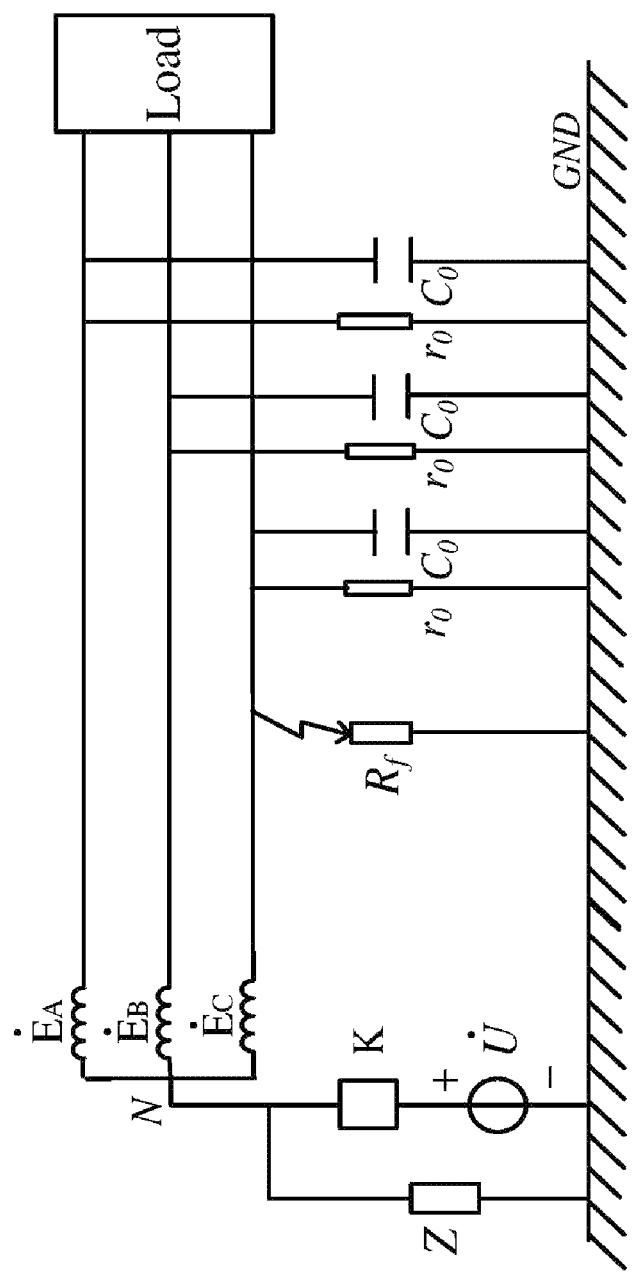
FIG. 6 is a principle diagram of safe operation of voltage reduction arc suppression of a ground fault phase of a non-effective ground generator.

As shown in FIG. 6, in a 20 kV non-effective ground generator, the three phases of power are respectively $E_A=E_B=E_C=20/\sqrt{3}$kV, the leakage resistance to ground $r_0$ of the generator stator is 20 kΩ, the capacitance to ground $C_0$ of the generator stator is 1.81 uF, K is a protection device (an overcurrent protection device or a fuse), the ground impedance Z of the neutral point N is j600Ω, a ground fault occurs in phase C of the distribution network, and the ground fault resistance $R_f$ is 2 kΩ. After the fault occurs, before an external voltage source is applied, the measured fault phase voltage $U_{C0}$ is 2.76 kV, and the critical voltage for sustaining continuous burning of a ground arc is 2.20 kV. At this time, the external adjustable voltage source is applied between the neutral point of the non-effective ground generator and the ground, the normal voltage $U_1$ of an access point when the normal generator voltage source is not connected is 0 V, then $\dot{U}=\dot{U}_1-\dot{E}_C+\dot{U}_{C1}$, and the external voltage source $\dot{U}$ is regulated to reduce the fault phase voltage $U_{C1}$ to be lower than a voltage for continuous burning of the ground arc, that is, $U_{C1}$<2.20 kV, thus achieving ground fault arc blowout. In this example, if the fault phase voltage $U_{C1}$ is reduced for arc suppression at 2.13 kV, the amplitude of voltage output by the voltage source may be adjusted first as U=9.41 kV, and then the contactor KM2 is closed to reduce the fault phase voltage to 2.13 kV, which satisfies the fault phase voltage operating range [0, 2.76 kV). At this time, the non-fault phase voltage is 18.27 kV, which is smaller than the line voltage 20 kV, thereby realizing arc suppression of the ground fault phase. Meanwhile, the non-fault phase voltage does not rise to the line voltage, thereby realizing safe operation of voltage reduction arc suppression.

As an improvement of the present embodiment, after the ground fault is detected, the application of the external voltage source continues for a period of time, then the voltage source is disconnected, whether the ground fault exists is detected again, and if the fault does not exist, it is determined that the instantaneous ground fault has been extinguished to restore normal operation; otherwise, the external voltage source is applied again to continue the active voltage reduction operation of the ground fault phase; where the duration of the external voltage source is (0.1 s, 60 s).

In order to verify the feasibility of the safe operation method for voltage reduction arc suppression of a ground fault phase of a non-effective ground system according to the present invention, the safe operation method for voltage reduction arc suppression of the ground fault phase of a 10 kV non-effective ground distribution network shown in FIG. 1 was simulated and analyzed in PSCAD simulation software: the simulation duration is 0.12 s, a single-phase ground fault occurred at 0.04 s in the system; the switch is turned on at 0.08 s to apply the external voltage source between the neutral point and the ground; the simulation results before and after the single-phase ground fault (ground fault resistance 1 kΩ) of the non-effective ground distribution system is shown in Table 1.

TABLE 1

| Fault current (A) | | Fault phase voltage (kV) | | Non-fault phase voltage (kV) | Voltage source |
|---|---|---|---|---|---|
| During fault | After voltage reduction | During fault | After voltage reduction | After voltage reduction | voltage (kV) |
| 2.71 | 0 | 2.60 | 1.82 | 8.51 | 3.95 |

It can be known by comprehensive analysis on the data in Table 1 that, after the ground fault occurs and the voltage source is applied, the fault phase voltage is reduced to operate at 1.82 kV, in a range of [0, $U_{\varphi0}$), $U_{\varphi0}$=2.60 kV is the fault phase voltage before the external voltage source is applied, and the non-fault phase voltage is 8.51 kV at this time, which is smaller than the line voltage 10 kV. The simulation results show that the present invention not only reduces the fault phase voltage to meet the requirements of long-time non-stop safe operation, but also reduces the risk of non-fault phase insulation breakdown to greatly improve the reliability and safety of power supply.

What is claimed is:

1. A safe operation method for voltage reduction arc suppression of a ground fault in a phase of a non-effective ground system, for use in ground fault safe operation of a neutral point non-effective ground generator or distribution network, wherein when a single-phase ground fault occurs, an external voltage source is applied at a non-effective ground system side between a bus and a ground, or between a line and the ground, or between a neutral point and the ground, or between a shunting tap of a non-effective ground system side winding of a transformer and the ground, and a voltage output by the external voltage source is $\dot{U}=\dot{U}_1+\Delta\dot{U}_0$, so that a fault phase voltage is reduced to achieve voltage arc suppression and an active voltage reduction operation of the ground fault; where $\dot{U}_1$ is a normal voltage of an access point when a normal grid voltage source is not connected, a variation of zero sequence voltage $\Delta\dot{U}_0$ is calculated from formula $\Delta\dot{U}_0=\dot{U}_{03}-\dot{U}_{01}$ or $\Delta\dot{U}_0=\dot{U}_{\varphi1}-\dot{E}_\varphi$, $\dot{U}_{03}$ is a zero sequence voltage after the active voltage reduction operation, $\dot{U}_{01}$ is a zero sequence voltage under a normal operation, $\dot{E}_\varphi$ is a power voltage of a ground fault phase, $\dot{U}_{\varphi1}$ is the fault phase voltage in a range of [0, $U_{\varphi0}$) after the external voltage source is applied, and $U_{\varphi0}$ is the fault phase voltage before the external voltage source is applied.

2. The safe operation method for voltage reduction arc suppression of the ground fault in the phase of the non-effective ground system according to claim 1, wherein during the voltage reduction operation, a current $\dot{I}$ injected by the external voltage source is measured and calculated, and a magnitude and a phase of the external voltage source $\dot{U}$ are regulated to establish formula $\dot{I}=\Delta\dot{U}\cdot\Sigma Y_0$, so that the arc of a fault point is suppressed, where $\Sigma Y_0$ is a zero sequence admittance to a ground when the non-effective ground system runs normally.

3. The safe operation method for voltage reduction arc suppression of the ground fault in the phase of the non-effective ground system according to claim 2, wherein the input voltage of the external voltage source comes from a secondary side voltage of the transformer of the non-effective ground system, and is identical to the fault phase power voltage in phase.

4. The safe operation method for voltage reduction arc suppression of the ground fault in the phase of the non-effective ground system according to claim 2, wherein a single-phase voltage regulator is installed in the external voltage source to regulate the amplitude of the voltage.

5. The safe operation method for voltage reduction arc suppression of the ground fault in the phase of the non-effective ground system according to claim 1, wherein during the voltage reduction operation, a damping rate $$d = \frac{g}{\omega C} = \frac{U_0 g}{U_0 \omega C} = \frac{I_{0R}}{I_{0C}} = \frac{P_o}{Q_0} = \cot\alpha_0$$

of the non-effective ground system or the damping rate of the ground fault line is measured and calculated; if the damping rate d is greater than a setting value, the magnitude and phase of the voltage $\dot{U}$ output by the external voltage source are regulated, so that the fault phase voltage is further reduced to suppress the fault arc until d is smaller than or equal to the setting value, that is, fault arc blowout is determined, and safe operation of active voltage reduction of the ground fault phase is achieved; where g is a three-phase conductance to ground, ω is an angular frequency of the system, C is a three-phase capacitance to ground, $U_0$ is a zero sequence voltage, $I_{OR}$ is a zero sequence active current, $I_{OC}$ is a zero sequence capacitance current, $P_0$ is a zero sequence active power, $Q_0$ is a zero sequence reactive power, and $α_0$ is a zero sequence admittance angle.

6. The safe operation method for voltage reduction arc suppression of the ground fault in the phase of the non-effective ground system according to claim 5, wherein the setting value of the damping rate d is set to be $K_3$ times the damping rate of the system or the line in normal operation; and the coefficient $K_3$ is in a range of (1, 5].

7. The safe operation method for voltage reduction arc suppression of the ground fault in the phase of the non-effective ground system according to claim 6, wherein the input voltage of the external voltage source comes from a secondary side voltage of the transformer of the non-effective ground system, and is identical to the fault phase power voltage in phase.

8. The safe operation method for voltage reduction arc suppression of the ground fault in the phase of the non-effective ground system according to claim 5, wherein the input voltage of the external voltage source comes from a secondary side voltage of the transformer of the non-effective ground system, and is identical to the fault phase power voltage in phase.

9. The safe operation method for voltage reduction arc suppression of the ground fault in the phase of the non-effective ground system according to claim 5, wherein a single-phase voltage regulator is installed in the external voltage source to regulate the amplitude of the voltage.

10. The safe operation method for voltage reduction arc suppression of the ground fault in the phase of the non-effective ground system according to claim 1, wherein during the voltage reduction operation of the distribution network, the zero sequence current of the ground fault line is measured; if the zero sequence current is greater than a setting value, the magnitude and phase of the voltage U̇ output by the external voltage source are regulated, so that the fault phase voltage is further reduced to suppress the fault current until the zero sequence current of the ground fault line is smaller than or equal to the setting value, and safe operation of active voltage reduction of the ground fault phase is achieved.

11. The safe operation method for voltage reduction arc suppression of the ground fault in the phase of the non-effective ground system according to claim 10, wherein the input voltage of the external voltage source comes from a secondary side voltage of the transformer of the non-effective ground system, and is identical to the fault phase power voltage in phase.

12. The safe operation method for voltage reduction arc suppression of the ground fault in the phase of the non-effective ground system according to claim 10, wherein a single-phase voltage regulator is installed in the external voltage source to regulate the amplitude of the voltage.

13. The safe operation method for voltage reduction arc suppression of the ground fault in the phase of the non-effective ground system according to claim 1, wherein after the ground fault is detected, the application of the external voltage source continues for a period of time, then the external voltage source is disconnected, whether the ground fault exists is detected again, and if the fault does not exist, it is determined that the instantaneous ground fault has been extinguished to restore normal operation; otherwise, the external voltage source is applied again to continue the active voltage reduction operation of the ground fault phase.

14. The safe operation method for voltage reduction arc suppression of the ground fault in the phase of the non-effective ground system according to claim 13, wherein the input voltage of the external voltage source comes from a secondary side voltage of the transformer of the non-effective ground system, and is identical to the fault phase power voltage in phase.

15. The safe operation method for voltage reduction arc suppression of the ground fault in the phase of the non-effective ground system according to claim 13, wherein a single-phase voltage regulator is installed in the external voltage source to regulate the amplitude of the voltage.

16. The safe operation method for voltage reduction arc suppression of the ground fault in the phase of the non-effective ground system according to claim 1, wherein the external voltage source is a voltage source with adjustable amplitude and phase realized by power electronic components, or a voltage source output by an external single-phase transformer.

17. The safe operation method for voltage reduction arc suppression of the ground fault in the phase of the non-effective ground system according to claim 16, wherein the input voltage of the external voltage source comes from a secondary side voltage of the transformer of the non-effective ground system, and is identical to the fault phase power voltage in phase.

18. The safe operation method for voltage reduction arc suppression of the ground fault in the phase of the non-effective ground system according to claim 1, wherein the input voltage of the external voltage source comes from a secondary side voltage of the transformer of the non-effective ground system, and is identical to the fault phase power voltage in phase.

19. The safe operation method for voltage reduction arc suppression of the ground fault in the phase of the non-effective ground system according to claim 1, wherein a single-phase voltage regulator is installed in the external voltage source to regulate the amplitude of the voltage.

20. The safe operation method for voltage reduction arc suppression of the ground fault in the phase of the non-effective ground system according to claim 1, wherein a protection device is arranged in the output circuit of the external voltage source to prevent the equipment from being damaged by high current.

* * * * *